US007297878B2

(12) United States Patent
Kushitani et al.

(10) Patent No.: US 7,297,878 B2
(45) Date of Patent: Nov. 20, 2007

(54) HIGH FREQUENCY LAMINATED COMPONENT AND ITS MANUFACTURING METHOD

(75) Inventors: Hiroshi Kushitani, Izumisano (JP); Ichiro Kameyama, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 73 days.

(21) Appl. No.: 10/499,978

(22) PCT Filed: Dec. 22, 2003

(86) PCT No.: PCT/JP03/16426

§ 371 (c)(1),
(2), (4) Date: Jun. 24, 2004

(87) PCT Pub. No.: WO2004/064466

PCT Pub. Date: Jul. 29, 2004

(65) Prior Publication Data

US 2005/0012566 A1 Jan. 20, 2005

(30) Foreign Application Priority Data

Jan. 14, 2003 (JP) ............................ 2003-005675

(51) Int. Cl.
*H01R 12/04* (2006.01)
*H05K 1/11* (2006.01)

(52) U.S. Cl. ...................................... 174/264; 174/262

(58) Field of Classification Search ................ 174/260, 174/261, 264, 262, 263; 361/792, 794, 795, 361/796; 333/33, 245, 260, 185, 175

See application file for complete search history.

(56) References Cited

U.S. PATENT DOCUMENTS

| | | | | |
|---|---|---|---|---|
| 4,544,577 | A | | 10/1985 | May |
| 4,759,965 | A | | 7/1988 | Kato et al. |
| 4,816,323 | A | * | 3/1989 | Inoue ......................... 428/210 |
| 5,293,502 | A | | 3/1994 | Kimura et al. |
| 5,454,161 | A | | 10/1995 | Beilin et al. |
| 5,576,518 | A | * | 11/1996 | Shibuya et al. ............. 174/264 |
| 6,132,853 | A | * | 10/2000 | Noddin ........................ 428/209 |
| 6,228,511 | B1 | * | 5/2001 | Sachdev et al. ............ 428/626 |
| 6,312,791 | B1 | * | 11/2001 | Fasano et al. .............. 428/210 |
| 6,608,371 | B2 | * | 8/2003 | Kurashima et al. ......... 257/686 |
| 6,787,710 | B2 | * | 9/2004 | Uematsu et al. ............ 174/261 |
| 2001/0011571 | A1 | | 8/2001 | Farooq et al. |

FOREIGN PATENT DOCUMENTS

| | | |
|---|---|---|
| EP | 0 682 363 A2 | 11/1995 |
| EP | 0 260 857 | 3/1998 |
| JP | 6-97671 | 4/1994 |
| JP | 11-68275 | 3/1999 |

* cited by examiner

*Primary Examiner*—Ishwar (I. B.) Patel
(74) *Attorney, Agent, or Firm*—Steptoe & Johnson LLP

(57) ABSTRACT

The present invention relates to a high frequency laminated component, which is used in a high frequency apparatus such as a radio communication apparatus, and its manufacturing method. An object thereof is to downsize the high frequency laminated component. To achieve the object, according to the high frequency laminated component of the present invention, dielectric layer (4) whose dielectric constant is lower than that of other areas is formed around via-hole electrode (3) in a dielectric. By forming dielectric layer (4) having a low dielectric constant, electric interference between via-hole electrode (3) and circuit electrode (22) is restrained, so that the circuit electrode and the via-hole electrode can be formed more closely each other compared with a conventional one. As a result, the high frequency laminated component can be downsized.

7 Claims, 2 Drawing Sheets

HIGH FREQUENCY LAMINATED COMPONENT AND ITS MANUFACTURING METHOD

TECHNICAL FIELD

The present invention relates to a high frequency laminated component, which is used in a high frequency apparatus such as a radio communication apparatus, and its manufacturing method.

BACKGROUND ART

In general, a high frequency component, which is used in a high frequency apparatus such as a high frequency filter or a high frequency switch, forms a high frequency circuit by positioning a plurality of circuit electrodes between layers of a multilayer substrate made of dielectric material and connecting these circuit electrodes through a via-hole electrode.

This high frequency laminated component is formed as following steps: Forming the circuit electrodes and the via-hole electrode at a dielectric sheet which is not sintered, and then piling and baking the plurality of dielectric sheets.

Japanese Patent Unexamined Publication H9-214274 is known as a prior art information in this technical field.

Recently, this high frequency laminated component has been required to be more downsized.

SUMMARY OF THE INVENTION

According to a high frequency laminated component of the present invention, in a multilayer substrate, a dielectric around a via-hole electrode has a lower dielectric constant than that of other areas. Using the structure discussed above, electric interference between a circuit electrode and the via-hole electrode is restrained, so that the circuit electrode and the via-hole electrode can be formed more closely each other compared with a conventional one. As a result, the high frequency laminated component can be downsized.

In addition, according to a method of manufacturing the high frequency laminated component of the present invention, low-temperature sintering material where a glass ingredient is contained in dielectric material is used as a dielectric sheet forming a dielectric layer, and a via-hole is formed by a laser in a boring process. Using the method discussed above, the glass ingredient is deposited at an inner circumference of the via-hole.

DETAILED DESCRIPTION OF PREFERRED EMBODIMENTS

When a high frequency laminated component is structured, a circuit electrode is formed horizontally and a via-hole electrode is formed vertically in a multilayer substrate having a certain dielectric constant, so that the circuit electrode and the via-hole electrode are easily interfered with each other. In general, the via-hole electrode and the circuit electrode, which is not directly connected thereto, have to be placed separately each other at a certain distance for restraining the mutual interference therebetween. On the contrary, according to a high frequency laminated component of the present invention, a dielectric layer (i.e., a first dielectric layer) around a via-hole electrode has a lower dielectric constant than that of other areas, so that the high frequency laminated component can be downsized.

Exemplary embodiments are demonstrated hereinafter with reference to accompanying drawings.

EXEMPLARY EMBODIMENT

Figure 1:
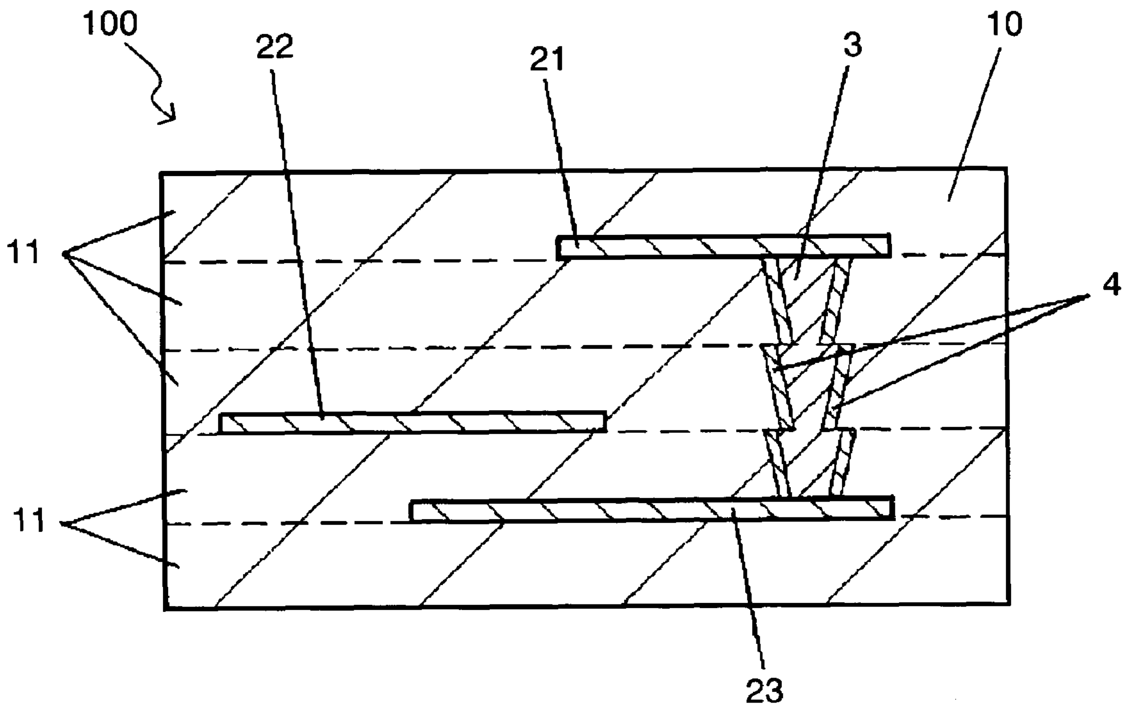
FIG. 1 is a sectional view of a high frequency laminated component in accordance with an exemplary embodiment of the present invention.

FIG. 1 is a sectional view of a high frequency laminated component used in a high frequency apparatus such as a high frequency filter or a high frequency switch. Circuit electrodes 21, 22 and 23, which forms a high frequency circuit, and via-hole electrode 3, which couples circuit electrodes 21 and 23, are formed inside multilayer substrate 100 made of dielectric 10.

Next, a method of manufacturing the high frequency laminated component is described hereinafter.

First, a via-hole for via-hole electrode 3 is formed at a certain position of a dielectric sheet which forms dielectric layer 11 (i.e., a second dielectric layer) of multilayer substrate 100. Second, the via-hole is filled with electrode paste, and circuit electrodes 21, 22 and 23 are applied on dielectric layer 11. Third, the dielectric sheets, where circuit electrodes 21-23 and via-hole electrode 3 are formed, are piled so as to construct a laminated member. Last, the laminated member 10 is baked, whereby the high frequency laminated component is completed.

When ceramic material containing low-melting glass is used as material of the dielectric sheet forming dielectric layer 11, the dielectric sheet and the electrode paste can be simultaneously baked.

According to the manufacturing method of the present invention, a laser is used in a boring process for forming via-hole electrode 3 in the dielectric sheet. By forming the via-hole using the laser, a glass ingredient which has been contained in the dielectric sheet is deposited at an inner circumference of the via-hole, so that a glass layer is formed at a circumference of via-hole electrode 3.

Specifically, in a case where material of the dielectric sheet is formed of dielectric material which has a dielectric constant of approximately 10 and contains glass having a dielectric constant of approximately 5, a dielectric constant of the dielectric sheet after baking becomes approximately 7. On the other hand, low dielectric layer 4 (i.e., a first dielectric layer), which is formed of glass having a dielectric constant of approximately 5, is formed with a certain thickness near via-hole electrode 3 bored by the laser.

Therefore, via-hole electrode 3 extending vertically in multilayer substrate 100 is surrounded with low dielectric layer 4. Accordingly, mutual interference between circuit electrode 22 and via-hole electrode 3 is restrained, though circuit electrode 22 is formed horizontally and two dimensionally for dielectric layer 11 and easy to be electrically contacted with via-hole electrode 3. As a result, the high frequency laminated component can be downsized because circuit electrode 22 and via-hole electrode 3 can be formed closely each other compared with a conventional one.

A carbon dioxide laser having a great power is preferably used as the laser in the boring process. Deposition of the glass becomes greater by using the great power laser, so that low dielectric layer 4 can be formed thicker.

On the other hand, in the high frequency laminated component discussed above, according to development of a high frequency of a frequency band and downsizing of a frequency component in recent years, via-hole electrode 3, which was conventionally used only as an electrode for connecting, has been utilized as inductance. Therefore, high impedance of via-hole electrode 3 is necessary for forming inductance.

In a word, electrical coupling between an earth electrode, which is one of circuit electrodes 21, 22 and 23 formed in multilayer substrate 100, and via-hole electrode 3 is restrained by surrounding via-hole electrode 3 with low dielectric layer 4 for performing high impedance. Accordingly, via-hole electrode 3 can be effectively utilized as inductance.

Figure 2:
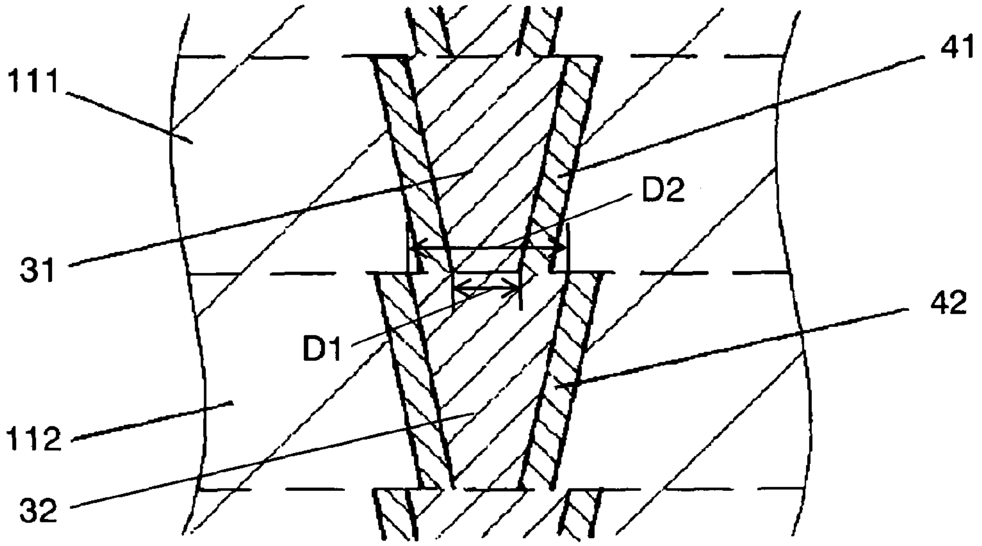
FIG. 2 is a sectional view of an essential part of the high frequency laminated component showing a via-hole electrode in accordance with the exemplary embodiment of the present invention.

In addition, according to the high frequency laminated component of the present embodiment, a diameter of via-hole electrode 3, which is formed across multilayered dielectric layers 11, is not constant in a direction of thickness. At a connecting point of via-hole electrodes 3 between dielectric layers 11, an upper part of via-hole electrodes 3 differs from a lower part thereof in a diameter. As shown in FIG. 2 which is an enlarged view of a part of the via-hole, the via-hole formed through dielectric layers 111 and 112 is processed to be tapered from an upper side to a lower side. As a result, at a connecting point between via-hole electrodes 31 and 32, which are formed by filling two via-holes with an electric conductor, diameter D2 of via-hole electrode 32 is larger than diameter D1 of via-hole electrode 31. Besides, via-hole electrodes 31 and 32 are respectively surrounded with low dielectric layers 41 and 42.

Using the structure discussed above, SIR (Step-Impedance-Resonator) effect that impedance varies inside a series of via-hole electrode 3 is induced, so that greater inductance can be added to via-hole electrode 3.

Figure 3:
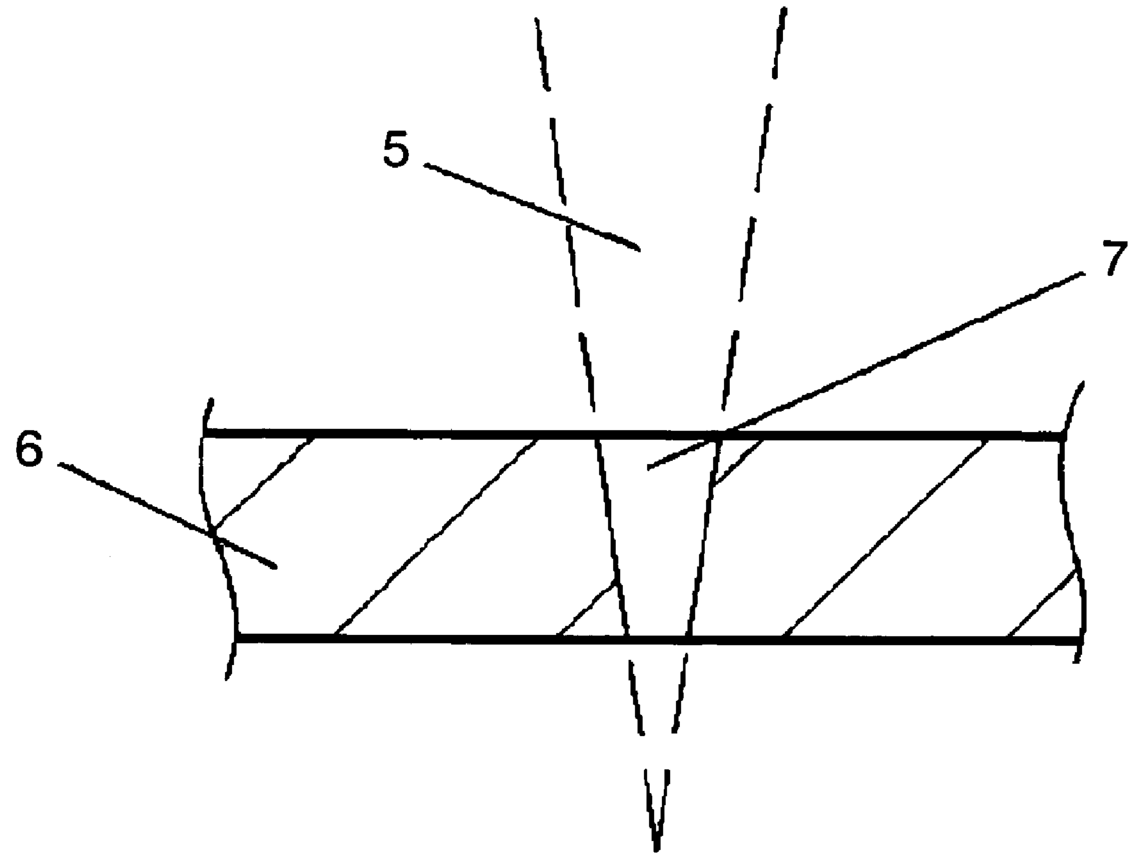
FIG. 3 is a schematic view showing a boring process of the high frequency laminated component in accordance with the exemplary embodiment of the present invention.

As discussed above, as the method for forming different diameters at the upper part and the lower part of the connecting point of via-hole electrodes 3, converged beam 5 of the laser can be used in the boring process of the dielectric sheet as shown in a broken line of FIG. 3. Using the method shown in FIG. 3, via-hole 7 having taper for dielectric sheet 6 is easy to be manufactured without using a particular process.

In a word, in a case where the via-hole electrode is formed across the plurality of dielectric layers, inductance formed of the via-hole electrode itself becomes greater by changing impedance at the connecting point between dielectric layers. As a result, the high frequency laminated component can be more downsized.

According to the high frequency laminated component of the present embodiment discussed above, all high frequency components are constructed by circuit electrodes 21 and 22 formed in multilayer substrate 100. However, the same effect can be obtained by mounting active components such as a diode or a FET on multilayer substrate 100 for structuring a certain kind of high frequency component.

INDUSTRIAL APPLICABILITY

According to the present invention discussed above, a dielectric constant near a via-hole electrode is formed to be lower than that of other areas in a multilayer substrate, so that interference between a circuit electrode and the via-hole electrode can be restrained. As a result, a downsized high frequency laminated component can be provided because the circuit electrode and the via-hole electrode can be formed closely each other compared with a conventional one.

The invention claimed is:

1. A high-frequency laminated component comprising:

a plurality of first dielectric layers comprising ceramic material and glass material having a low melting temperature, each of said first dielectric layers further having a tapered via-hole therethrough, a plurality of second dielectric layers, each lining the tapered via-hole in each of said first dielectric layers, comprising the glass material and having a lower dielectric constant than said first dielectric layers, a via-hole electrode comprising an electrical conductor filling the via-holes and forming contiguous tapered electrical conductors, and a plurality of circuit electrode layers, each between adjacent first dielectric layers which surround the circuit electrode layers, wherein said via-hole electrode connects a plurality of said electrode layers.

2. The high frequency laminated component of claim 1, wherein each of the first dielectric layers has a first surface and a second surface, each of the tapered electrical conductors has a top face having a first diameter at the first surface and a bottom face having a second diameter at the second surface, the first diameter is smaller than the second diameter, and the top face of one tapered electrical conductor contacts the bottom face of a tapered electrical conductor in a continuous first dielectric layer.

3. The high frequency laminated component of claim 1, wherein impedance varies inside the via-hole electrode, and wherein the first dielectric layers comprise low-temperature sintering material.

4. The high frequency laminated component of claim 1, wherein the via-hole electrode has different impedance at a connecting point between the tapered electrical conductors.

5. A high frequency laminated component comprising:

a plurality of first dielectric layers formed contacting each other, each having a conical via-hole therethrough, a second dielectric layer lining the conical surface of each via-hole, a via-hole electrode comprising a plurality of directly abutting conical frustums, each of said conical frustums having a small base and a large base, the small base of one conical frustum directly abutting the large base of an adjacent conical frustum, wherein said plurality of first dielectric layers comprises ceramic material and glass material having a low melting temperature, and said second dielectric layer comprises said glass material.

6. The high frequency laminated component of claim 5, wherein the second dielectric layers have a lower dielectric constant than the first dielectric layers.

7. The high frequency laminated component of claim 5, wherein impedance varies inside the via-hole electrode, and wherein the first dielectric layers comprise low-temperature sintering material.

* * * * *